(12) United States Patent
Damon et al.

(10) Patent No.: US 6,424,161 B2
(45) Date of Patent: *Jul. 23, 2002

(54) APPARATUS AND METHOD FOR TESTING FUSES

(75) Inventors: Tim Damon, Meridian; Phillip E. Byrd, Boise, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,688

(22) Filed: Sep. 3, 1998

(51) Int. Cl.[7] ............... G01R 31/02; G01R 27/26; H01H 31/02
(52) U.S. Cl. ............... 324/550; 324/537; 324/677
(58) Field of Search ............... 324/550, 537, 324/711, 677

(56) References Cited

U.S. PATENT DOCUMENTS

| | | | | |
|---|---|---|---|---|
| 5,206,583 A | * | 4/1993 | Dawson et al. | 324/721 |
| 5,313,165 A | * | 5/1994 | Brokaw | 324/158.1 |
| 5,768,290 A | | 6/1998 | Akamatsu | 371/22.4 |
| 5,841,789 A | * | 11/1998 | McClure | 327/276 |
| 5,896,039 A | * | 4/1999 | Brannigan et al. | 324/763 |
| 5,952,833 A | * | 9/1999 | Morgan | 324/537 |
| 6,018,481 A | | 1/2000 | Shiratake | 365/190 |
| 6,256,239 B1 | | 7/2001 | Akita et al. | 365/200 |
| 6,268,763 B1 | * | 7/2001 | Fujikawa | 327/541 |

\* cited by examiner

*Primary Examiner*—Michael J. Sherry
*Assistant Examiner*—Jermele Hollington
(74) *Attorney, Agent, or Firm*—Schwegman, Lundberg, Woessner & Kluth, P.A.

(57) ABSTRACT

A voltage is applied across a control resistor, and the voltage is caused to decay. The decay is monitored by a testing circuit such as a comparator. When the voltage across the control resistor has decayed to a value less than or equal to a reference voltage in the comparator, a switch time period is established. Fuses in a memory device are tested against the established switch time period. The fuses are tested in a similar fashion: a voltage is applied across the fuse being tested, and the voltage is caused to decay. The comparator monitors the decay of the voltage across the fuse. If the resistance value of a fuse being tested is within specification, the comparator changes its state at a time equal to or less than the switch time period established for the control resistor. Testing time for fuses can further be minimized by having an external access to the reference in the comparator. In establishing the switch time period by applying a voltage across the control resistor, the voltage of the reference in the comparator is adjusted to establish quicker switch time periods against which fuses are tested. In this manner, testing time is minimized.

25 Claims, 7 Drawing Sheets

APPARATUS AND METHOD FOR TESTING FUSES

FIELD OF THE INVENTION

The present invention relates to semiconductor based memory devices, and in particular to testing fuses in integrated memory circuits.

BACKGROUND OF THE INVENTION

As the number of electronic elements contained on semiconductor integrated circuits continues to increase, the problems of reducing and eliminating defects in the elements become more difficult. To achieve higher electronic element population densities, circuit designers strive to reduce the size of the individual elements to maximize available die real estate, to increase speed of operation, to increase circuit density per chip, and the like. The reduced size of individual elements, however, makes these elements increasingly susceptible to defects caused by material impurities during fabrication. These defects can be identified upon completion of the integrated circuit fabrication by testing procedures, either at the semiconductor chip level or after complete packaging. Scrapping or discarding defective circuits is economically undesirable, particularly if only a small number of elements are actually defective.

Relying on zero defects in the fabrication of integrated circuits is an unrealistic option. To reduce the amount of semiconductor scrap, redundant elements are provided on the circuit. If a primary element is determined to be defective, a redundant element can be substituted for the defective element. Substantial reductions in scrap can be achieved by using redundant elements.

One type of integrated circuit device which uses redundant circuit elements is memory integrated circuits, such as, for example, dynamic random access memories (DRAMs), static random access memories (SRAMs), video random access memories (VRAMs), erasable programmable read only memories (EPROMs), synchronous dynamic random access memories (SDRAMs), FLASH memories, and other memory types. Typical integrated memory circuits comprise millions of equivalent memory cells arranged in arrays of addressable rows and columns. The rows and columns of memory cells are the primary circuit elements of the integrated memory circuit. By providing redundant circuit elements, either as rows or columns, defective primary rows or columns can be replaced.

Because the individual primary circuit elements (rows or columns) of an integrated memory circuit are separately addressable, replacing a defective circuit element typically entails programming fuses to cause a redundant circuit element to respond to the address of the defective primary circuit element. This process is very effective for permanently replacing defective primary circuit elements.

In the case of DRAMs, for example, a particular memory cell is selected by first providing a unique row address of the row in which the particular memory cell is located and subsequently providing a unique column address of the column in which the particular memory cell is located. Redundancy circuitry must recognize the address of the defective primary circuit element and reroute all signals to the redundant circuit element when the address to the defective primary circuit element is presented by the user. Therefore, a number of fuses or antifuses are associated with each redundant circuit element. The possible combinations of programmed fuses corresponding to each redundant circuit element represent unique addresses of all primary circuit elements for which a corresponding redundant circuit element may be substituted. While antifuses are described, fuses will function equally as well in the circuit.

Antifuses are typically fabricated with a structure similar to that of a capacitor, such that two conductive electrical terminals are separated by a dielectric layer. In the unprogrammed state, in which the antifuse is fabricated, there is a high resistance between the terminals, while in the programmed state, there is low resistance. To program an antifuse, a large programming voltage is applied across the antifuse terminals, breaking down the interposed dielectric and forming a conductive link between the antifuse terminals.

All antifuses are tested to ensure that they are properly programmed. A prior art technique for testing antifuses is shown in FIG. 1, which shows two reference nodes, SGND node 10 and node 20. The SGND node 10 is also in electrical communication with the input of a testing circuit, which is a comparator 30 which compares a hard wired reference voltage to the voltage on the SGND node 10. A precharge voltage 40 is applied to the SGND node 10. A switch 45 is interposed between precharge voltage 40 and SGND node 10 to turn the precharge voltage 40 on and off. The node 20 is connected to ground. Antifuses 50 are electrically interposed between the SGND node 10 and the node 20.

Fuse $F_1$ is one of the fuses in bank $B_1$. In order to test whether a good program has been achieved for fuse $F_1$, switch $SB_1$ for the bank $B_1$ is actuated while switch $SF_1$ is enabled. Having both switch $SB_1$ and switch $SF_1$ simultaneously actuated creates a direct path from SGND node 10 to node 20. Because the fuse $F_1$ has resistance and the bus to which it is connected has capacitance, upon actuation of both switch $SB_1$ and switch $SF_1$, the voltage of SGND node 10 decays in a manner consistent with an RC circuit. Prior to the actuation of switch $SB_1$ and switch $SF_1$, output of the comparator 30 is in a tri-state condition; however, as soon as switch $SB_1$ and switch $SF_1$ are actuated, the output of comparator 30 switches low. If fuse $F_1$ was properly programmed, the output of comparator 30 will switch back high at or before a switch time period $t_{fuse}$. If the output of comparator 30 does not switch back high at or before switch time period $t_{fuse}$, then fuse $F_1$ was not properly programmed.

The switch time period $t_{fuse}$ is typically determined by performing the following steps for a statistically valid number of fuses. First, the resistance of a fuse is measured. Techniques for measuring resistance are well known in the art; however, one way of measuring fuse resistance is by applying a voltage across a fuse, measuring the resulting current through the fuse, and calculating the resistance using Ohm's law. Second, a measurement is taken of the time it takes from when both the bank switch (such as, for example, $SB_n$ or $SB_1$) and the fuse switch (such as, for example, $SF_1$, $SF_2$, $SF_x$, etc.) are actuated for the output of the comparator 30 (as shown in FIG. 1) to swing to the high state. As an example, if fuse $F_2$ is being tested, both bank switch $SB_1$ and fuse switch $SF_2$ must be actuated. The measurement time obtained is referred to as a $t_{test}$ value. Third, the individual $t_{test}$ value for a particular fuse is plotted against the resistance value for such particular fuse, and this step is performed for all measured fuses. Fourth, a decision is made as to what resistance value is indicative of a fuse that has been programmed properly. For example, it may be decided that a resistance value of 300 KΩ or less indicated that the fuse being tested has been properly programmed. Finally, from the plot of $t_{test}$ versus resistance, as described in the third step above, it is determined at or under which $t_{test}$ value the comparator output switched for a majority of the fuses measured having resistance values of 300 KΩ or less.

The process of collecting and analyzing data for a statistically valid number of fuses can be lengthy. Accordingly, such process is performed offline. After data regarding fuse test times and resistance values are collected and analyzed, and a switch time period $t_{fuse}$ is established, individual fuses are then tested in accordance with the circuit shown in FIG. 1. This testing is performed during manufacturing or as the fuses are programmed.

Moreover, the comparator 30 has a reference 55 which, in the prior art, is hardwired to a particular voltage value. Hence, the switch time period $t_{fuse}$ is highly dependent on the voltage value to which the reference in the comparator 30 is connected. For example, suppose the reference in the comparator 30 is hardwired to 2.5 V, so that when the voltage level on SGND node 10 drops below 2.5 V the output of the comparator 30 switches high. It is possible for the output of the comparator 30 to switch even at a reference voltage greater than 2.5 V (e.g. 3.0 V), thus decreasing the testing time required. However, because the reference in the comparator 30 is hardwired to a particular voltage, it is difficult to change the reference voltage in the event tighter control over testing time is desired.

Accordingly, there is a need for testing fuses without having to collect sample points. There is further a need to make the process of testing fuses faster in order to save testing time during manufacture.

SUMMARY OF THE INVENTION

The present invention is directed to a method and circuit for testing fuses in memory integrated circuits such as those discussed above. One embodiment of the invention is a circuit comprising a test bank of control resistors and a testing circuit, wherein the bank of control resistors establishes a test period of all fuses being tested. In another aspect of the invention, the testing circuit comprises a comparator having a reference voltage for comparison to a node voltage, wherein an external access to the reference of the comparator is provided. This external access to the reference of the comparator permits the minimization of test times.

The step of determining the testing time for a fuse comprises the steps of allowing to decay the voltage applied to the node, and waiting a time period for the voltage applied to the node to decay to a voltage less than or equal to the reference voltage applied to the comparator. In another aspect of the invention, the method includes, after the step of comparing the testing time for the fuse against the testing time for the control resistor, the step of deciding whether the testing time for the fuse meets predetermined specification parameters based on the testing time for the control resistor. The use of the control resistor obviates the need for the prior art technique of collecting and analyzing data for a statistically valid number of fuses.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined by the appended claims.

Figure 2:
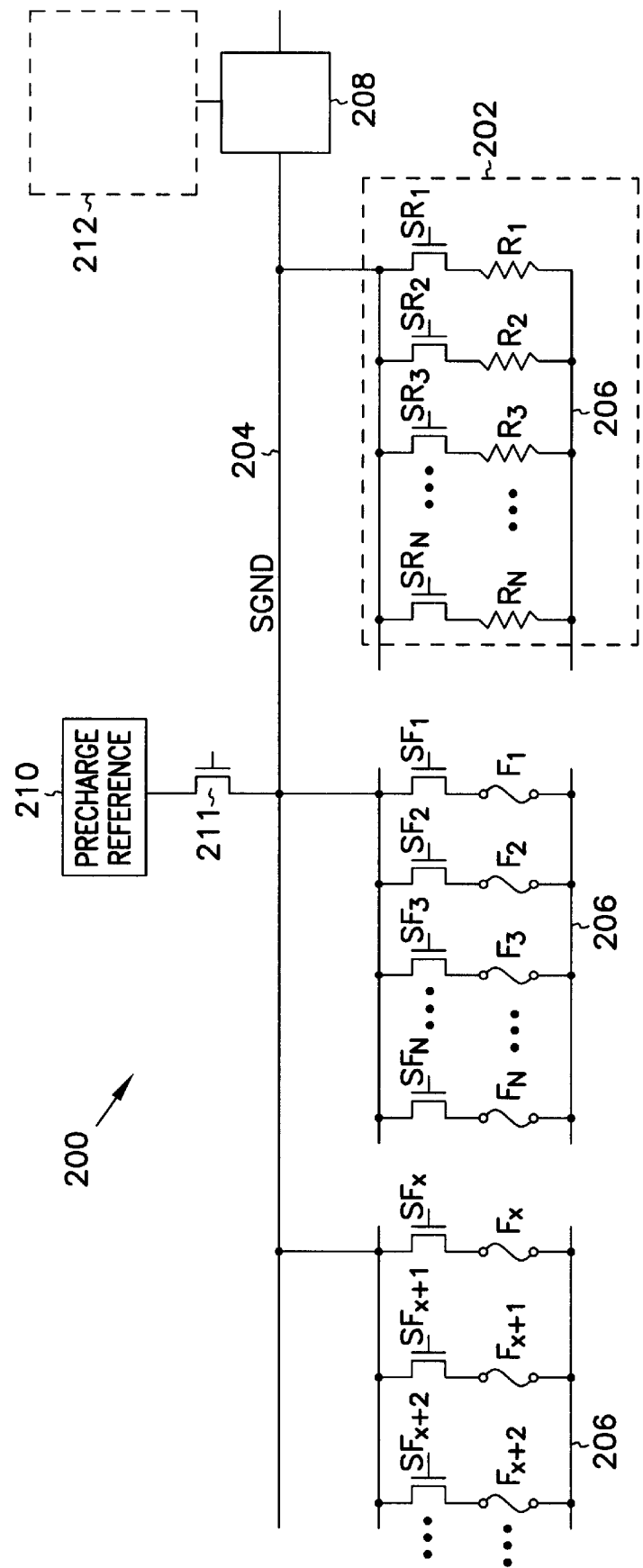
FIG. 2 is a circuit diagram showing an embodiment of the present invention.

FIG. 2 depicts an embodiment 200 of the present invention. A bank 202 comprising a plurality of control resistors comprising a plurality of resistors $R_1$, $R_2$, $R_3$, ... $R_N$, and a plurality of switches $SR_1$, $SR_2$, $SR_3$, ... $SR_N$, is electrically interposed between SGND or first supply node 204 and a second supply node 206, which is connected to a voltage lower than SGND node 204. The SGND node 204 is also in electrical communication with the input of a testing circuit, which, in this embodiment, comprises a comparator 208 for comparing the voltage on the SGND node 204 to a reference voltage 212 applied to another input of the comparator 208. A precharge voltage 210 is applied to the SGND node 204. A switch 211 is interposed between precharge voltage 210 and SGND node 204 to turn the precharge voltage 210 on and off. Reference voltage 212 is applied to an external reference of comparator 208. Reference voltage 212 may be variable, as will be discussed further below.

The bank 202 eliminates the need for offline collection and analysis of $t_{test}$ versus resistance values as in the prior art. Instead, a desired resistor value is chosen according to a design parameter. A specification may require a resistance value of 300 KΩ or less for programming. In FIG. 2, for example, resistors $R_1$ and $R_2$ may have resistance values of 750 KΩ and 500 KΩ, respectively. If switches $SR_1$ and $SR_2$ are actuated substantially at the same time while the rest of the switches in the bank 202 are left deactuated, the total resistance of bank 202 is the desired resistance of 300 KΩ.

Figure 3:
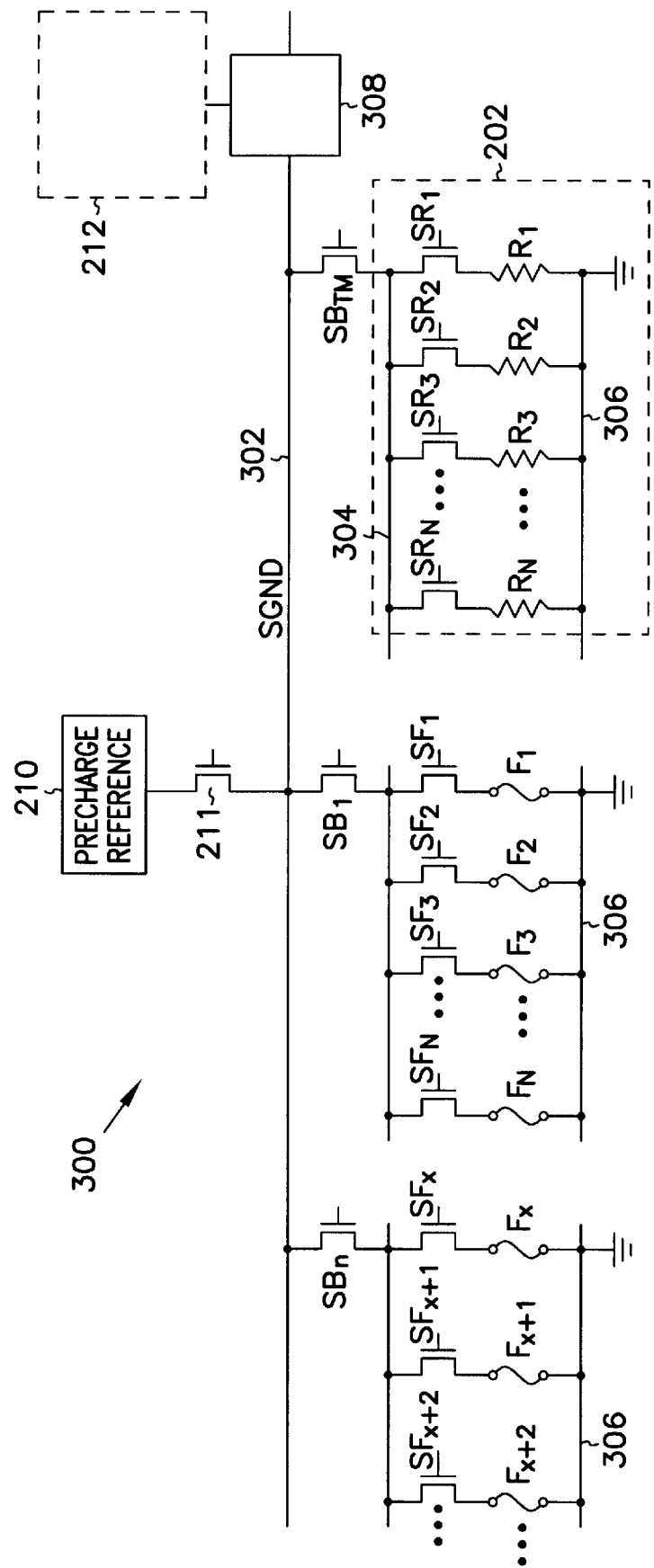
FIG. 3 is a circuit diagram showing another embodiment of the present invention.

In another embodiment shown in FIG. 3, switch $SB_{TM}$ is electrically interposed between SGND or first supply node 302 and bank 202. The resistors $R_1$, $R_2$, $R_3$, ... $R_N$ are connected in series with switches $SR_1$, $SR_2$, $SR_3$, ... $SR_N$ between node 304 and node 306. Node 304 is connected through $SB_{TM}$ to SGND or first node 302. In one embodiment, node 306 is connected to ground. If switch $SB_{TM}$ is actuated with both switches $SR_1$ and $SR_2$ actuated, the voltage of the SGND node 302 starts to decay in a manner consistent with an RC circuit (the capacitance comes from the SGND node). Reference voltage 212 is applied to an external reference of comparator 308. Reference voltage 212 may be variable, as will be discussed further below. Precharge voltage 210 is applied to SGND node 302.

Prior to the actuation of switch $SB_{TM}$ and switches $SR_1$ and $SR_2$, the output of the comparator 308 is in a tri-state condition. However, as soon as switch $SB_{TM}$ and switches $SR_1$ and $SR_2$ are actuated, the output of comparator 308 switches low. At a switch time period $t_{fuse}$, the output of comparator 308 will switch back high. The switch time period $t_{fuse}$ is then used as the standard against which the other fuses or antifuses will be measured during testing. In other words, if during testing of a fuse the output of comparator 308 remains low even after switch time period $t_{fuse}$ elapses, then such fuse was not properly programmed. Hence, the bank 202 eliminates the need for offline collection and analysis of $t_{test}$ versus resistance values as in the prior art.

Figure 6:
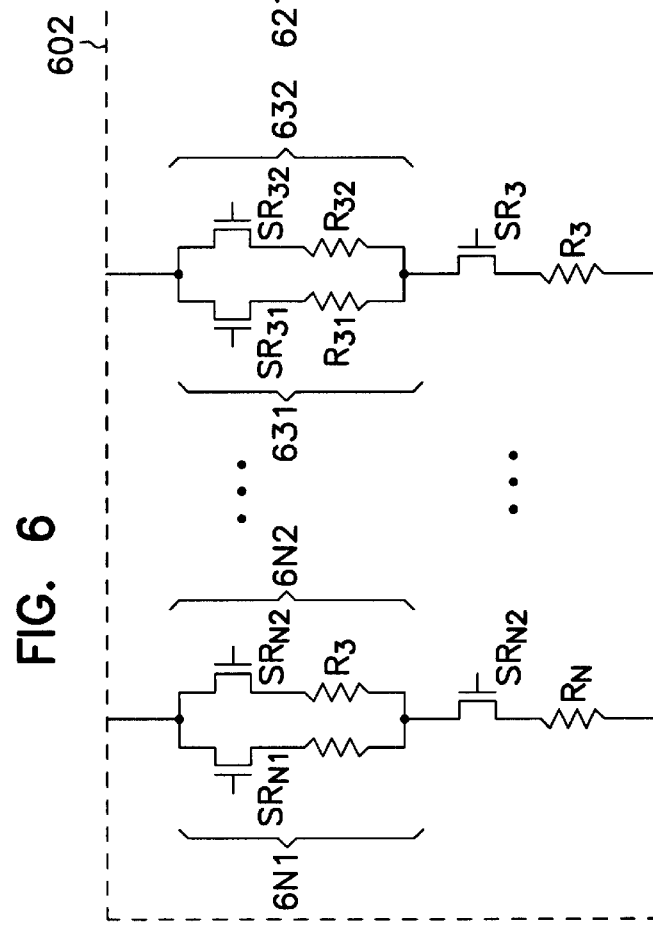
FIG. 6 is a representative circuit diagram showing an alternative resistance configuration.

It should be understood also that various configurations for the provision of selectable bank 202 may be employed without departing from the scope of the invention. Such selectable resistance configurations are known to those skilled in the art. For example, but not by way of limitation, FIG. 6 shows a representative alternative resistance configuration 602, which may be substituted for bank 202 without departing from the scope of the invention. FIG. 6 shows a plurality of control resistors comprising a plurality of resistors $R_1, R_2, R_3, \ldots R_N$, in series with a plurality of switches $SR_1, SR_2, SR_3, \ldots SR_N$, as in bank 202. These control resistors are also connected in series with a parallel configuration of legs comprising further resistors and fuses in series.

To form legs 612, 622, 632, ... 6N2, switches $SR_{12}, SR_{22}, SR_{32}, \ldots SR_{N2}$ are connected in series with resistors $R_{12}, R_{22}, R_{32}, \ldots R_{N2}$, respectively. To form legs 611, 621, 631, ... 6N1, switches $SR_{11}, SR_{21}, SR_{31}, \ldots SR_{N1}$ are connected in series with resistors $R_{11}, R_{21}, R_{31}, \ldots R_{N1}$. Legs 612 and 611 are connected in parallel with each other, and the parallel combination is connected in series with resistor $R_1$ and switch $SR_1$. Legs 622 and 621 are connected in parallel with each other, and the parallel combination is connected in series with resistor $R_2$ and switch $SR_2$. Legs 632 and 631 are connected in parallel with each other, and the parallel combination is connected in series with resistor $R_3$ and switch $SR_3$. Legs 6N2 and 6N1 are connected in parallel with each other, and the parallel combination is connected in series with resistor $R_N$ and switch $SR_N$.

Figure 4:
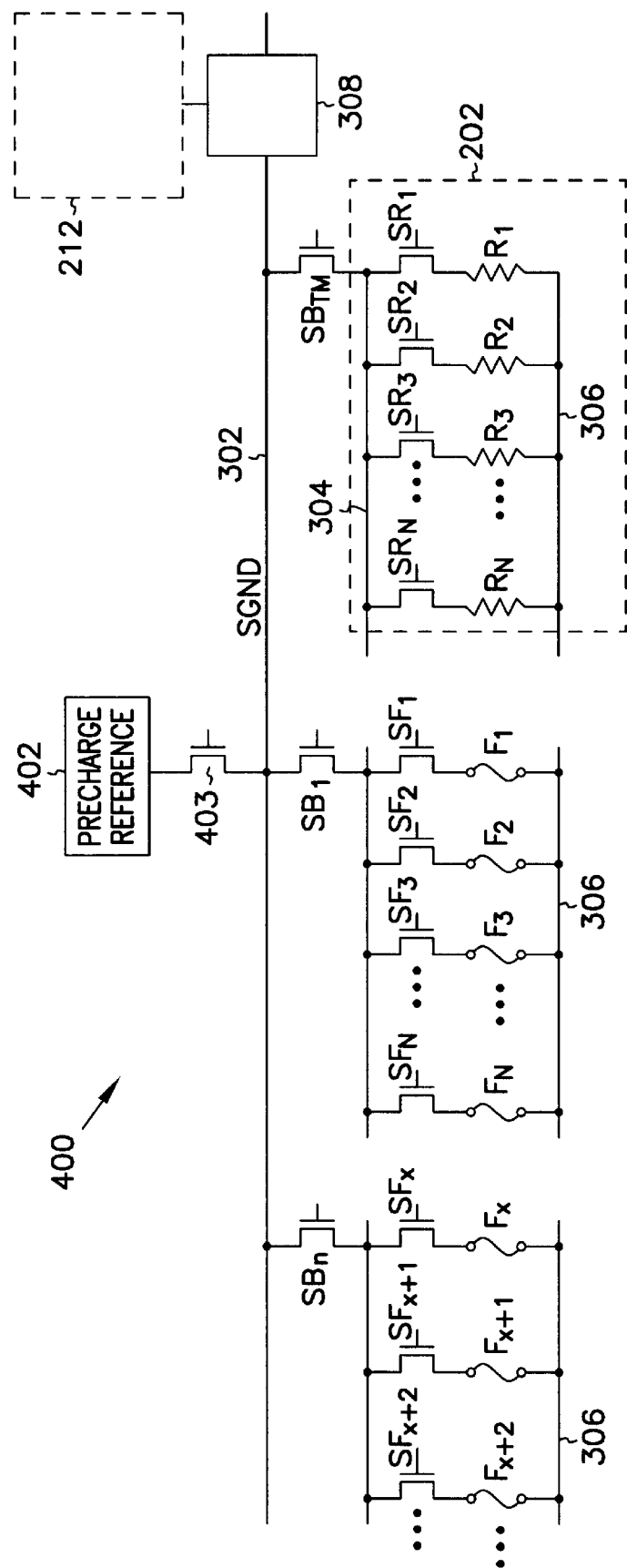
FIG. 4 is a circuit diagram showing yet another embodiment of the present invention.

In another embodiment 400 shown in FIG. 4, the SGND node 302 may be connected to a precharge voltage 402 through switch 403 to turn precharge voltage 402 on and off. Second supply node 306 may be connected to a voltage greater than the precharge voltage. In this embodiment, the voltage of the node 304 charges in a manner consistent with an RC circuit. Reference voltage 212 is applied to an external reference of comparator 308. Reference voltage 212 may be variable, as will be discussed further below.

Figure 5:
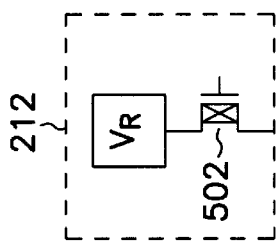
FIG. 5 is a circuit diagram showing an embodiment of a variable reference voltage.

The invention further provides for adjustment of test times through varying reference voltage $V_R$. Circuit 212 for accomplishing this ability to adjust the test times is shown in FIG. 5. An embodiment of circuit 212 is connected to an external access to a variable reference in either of comparators 208 or 308 of the embodiments shown in FIGS. 2–4, instead of the prior art hardwiring of the reference voltage of the comparators 208 or 308 to a particular voltage. As illustrated in FIG. 5, a comparator is connectable to a reference voltage $V_R$, which may be a variable voltage source, through transistor 502. While transistor 502 is shown as a p-channel transistor, any switching device or mechanism will also be acceptable without departing from the scope of the invention.

Figure 1:
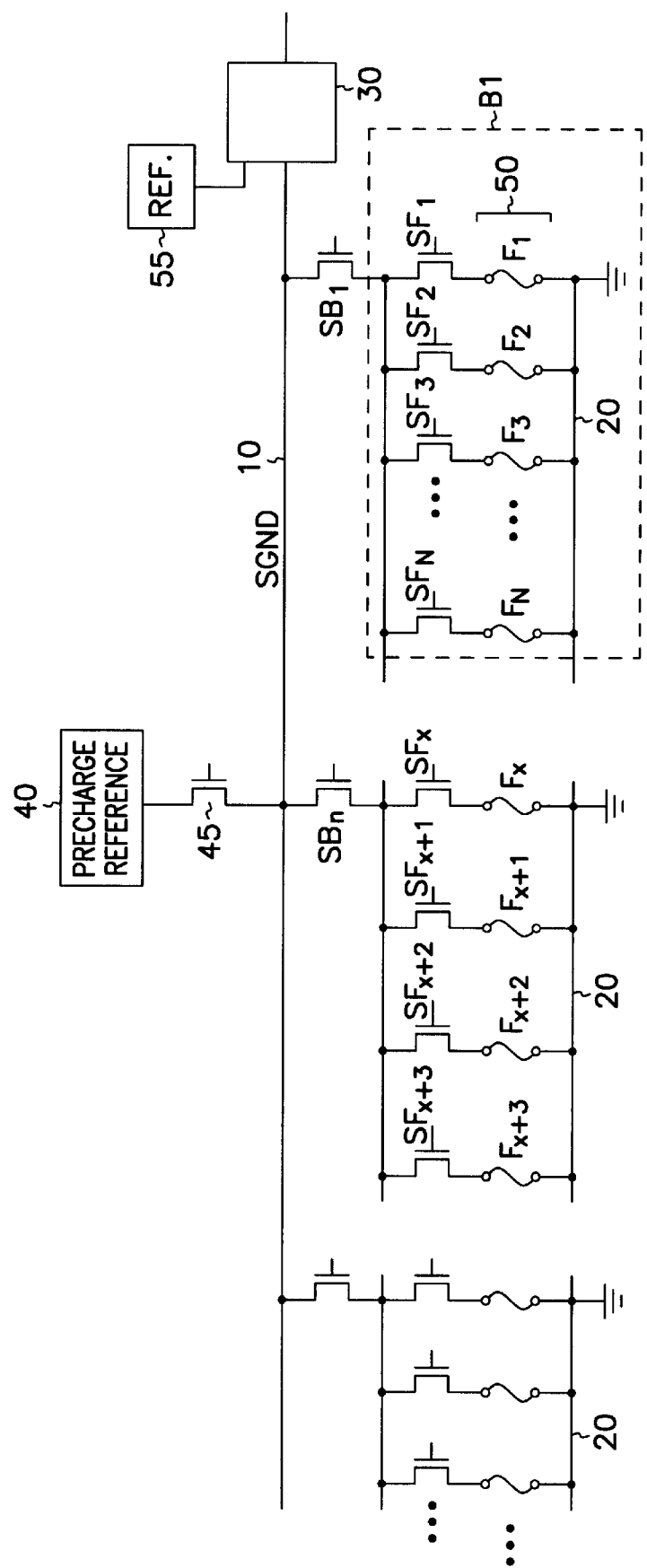
FIG. 1 is a circuit diagram depicting a prior art technique for testing fuses in integrated memory circuits.

For example, in prior art FIG. 1, the reference in the comparator 30 is ordinarily permanently connected to some hardwired reference voltage which permits the comparator 30 to switch at a switch time period $t_{fuse}$. As an example, assume the voltage to be 2.5 V, and the switch time period $t_{fuse}$ to be equal to 40 nanoseconds when the fuse has a resistance of 300 KΩ. Using external access circuit 212 by connecting it to a reference of either of comparators 208 or 308 in the embodiments of FIGS. 2–4, as provided by the present invention, $V_R$ can be changed to 3.0 V, permitting the comparator 208 or 308 to switch at a lower switch time period $t_{fuse}$ of for example 30 nanoseconds. Hence, a time savings of 10 nanoseconds is achieved by varying the reference voltage of comparator 208 or 308. The process can be repeated with $V_R$ greater than 3.0 V, such as 3.5 V. This new comparator reference voltage of 3.5 V may permit the comparator 208 or 308 to switch at a lower switch time period $t_{fuse}$ of for example 25 nanoseconds. The process can again be repeated as desired or until the comparator 208 or 308 no longer switches for a higher reference voltage. In this manner, the comparator reference voltage in any of the embodiments shown in FIGS. 2–4 can be optimized such that the switch time period $t_{fuse}$ can be minimized. Because all fuses are tested, the present invention permits a significant amount of testing time to be saved.

Although an iteration process has been described, one of ordinary skill in the art can appreciate that other techniques may be substituted for optimizing the switch time period $t_{fuse}$ without departing from the scope of the invention.

Another embodiment of the invention is a method comprising the steps of determining a testing time for a control resistor, determining a testing time for a fuse, and comparing the testing time for the fuse against the testing time for the control resistor. The step of determining the testing time for the control resistor comprises the steps of allowing to decay a voltage applied to a node, wherein the voltage applied to the node is also an input to a testing circuit, and waiting a time period for the voltage applied to the node to decay to a voltage less than or equal to a reference voltage of the testing circuit.

Figure 7:
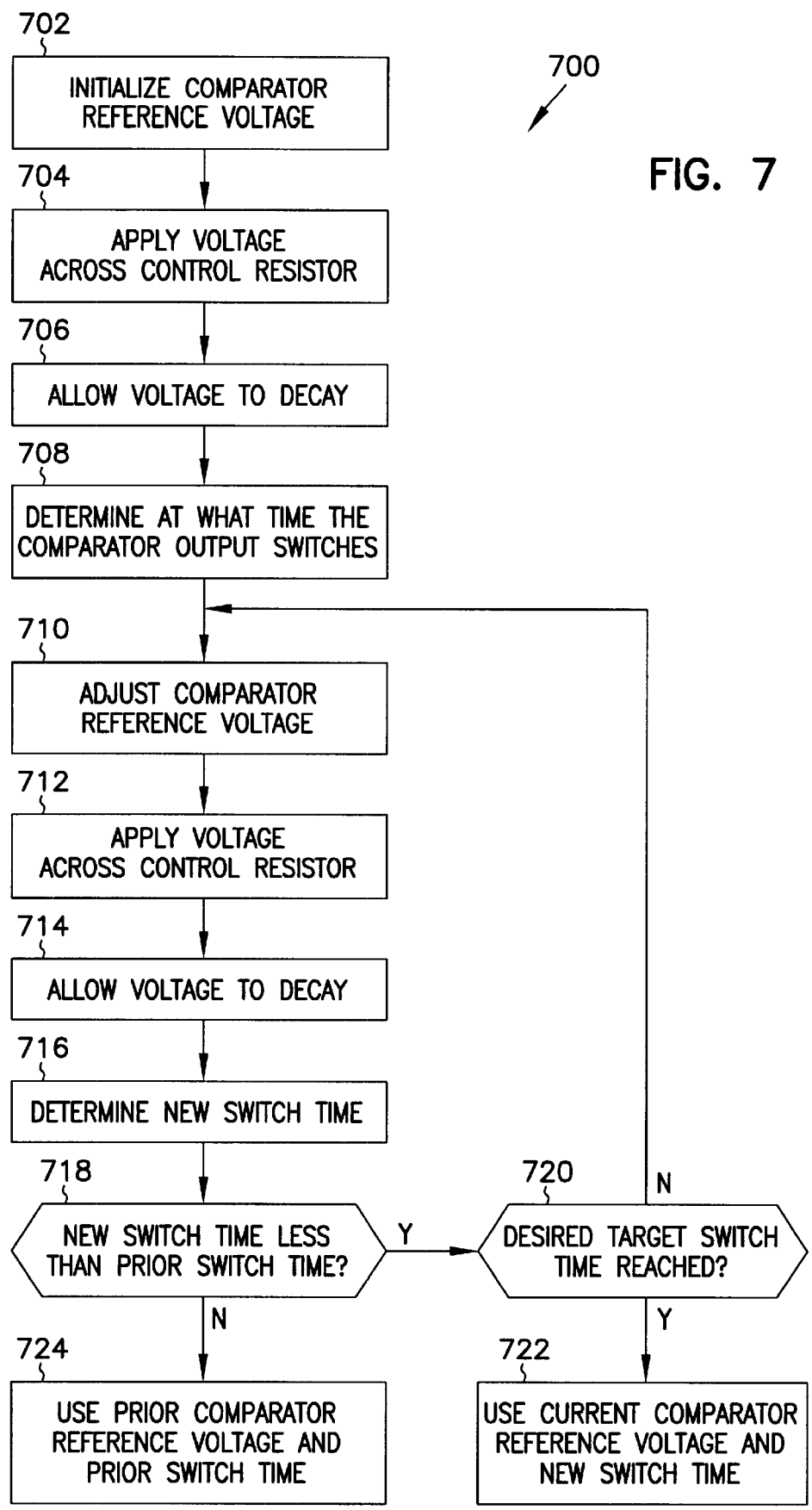
FIG. 7 is a flowchart block diagram depicting a method of the present invention.

An embodiment 700 of the process of optimizing test times is now described generally in relation to FIG. 7. The comparator reference voltage is initialized in step 702. A voltage is applied across a control resistor in step 704. This voltage is then allowed to decay in step 706. The time at which the comparator output switches is determined in step 708. The comparator reference voltage is adjusted in step 710. The voltage again is applied across the control resistor in step 712, and the voltage is allowed to decay in step 714. The time at which the comparator output switches is determined in step 716. In step 718, if the most recent switch time period is less than the previous switch time period, then a determination is made in step 720 as to whether a desired or preselected target switch time has been reached. If a desired target switch time has not been reached, the process is repeated starting with step 710. If a desired target switch time has been reached, then in step 722, the current comparator reference voltage and new switch time are used as parameters against which fuses are to be tested.

Referring again to step 718, however, if the most recent switch time period is not less than the previous switch time period, in step 724 the previous switch time period and the previous value of the comparator reference voltage are used in performing subsequent testing of fuses in a memory device.

The above description discusses an embodiment in which a precharge reference 210 is applied either to SGND node 204 or 302 in the embodiments of FIGS. 2 or 3–4 respectively while either node 206 or 306 in the embodiments of FIGS. 2 and 3–4 respectively is connected to ground, and wherein the actuation of a bank switch (such as $SB_1$) along with a fuse switch (such as $SF_1$) allows the voltage across a fuse (in this example, $F_1$), which is the voltage at SGND node 204 or 302, to decay. However, the present invention applies equally well to a situation wherein the node 206 or 306 is at a higher potential than the SGND node 204 or 302 (i.e., the SGND node 204 or 302 is initialized to some voltage lower than node 206 or 306), and wherein the actuation of a bank switch (such as $SB_1$) along with a fuse switch (such as $SF_1$) causes the voltage across a fuse (in this example, $F_1$) to charge (instead of decay) in a manner consistent with an RC circuit. The circuit embodiments of FIGS. 2–4 will operate in a fashion similar to what has been previously described for the situation where the voltage across a fuse is allowed to decay. Hence, even where the voltage across a fuse is caused to charge in a manner consistent with an RC circuit, testing circuit or comparator 208 or 308 still compares the voltage on the SGND node 204 or 302 against the respective comparator reference.

In another embodiment, instead of allowing a decay in voltage to perform testing of a fuse, voltage across a fuse is caused to charge. The time it takes for the voltage across the fuse to reach a reference voltage in a testing circuit is compared against the time it takes for the voltage across a control resistor to charge up to the same reference voltage. A determination is then made as to whether the fuse is acceptable. This embodiment, where the voltage across a fuse is caused to charge in a manner consistent with an RC circuit, is also achieved with the external access circuit 212 to comparator reference by applying $V_R$ to the input of comparator 208 or 308 through transistor 502 as illustrated in FIG. 5.

In FIGS. 2–4, an external access to a reference in the comparator 208 or 308 may be provided, instead of the prior art configuration of hardwiring the reference voltage of the comparator 30 to a particular voltage. As illustrated in FIG. 2, the comparator 208 is connectable to a voltage $V_R$, which may be a variable voltage source, through transistor 502 (FIG. 5). In FIGS. 3–4, comparator 308 is connectable to a voltage $V_R$, which may be a variable voltage source, through transistor 502 (FIG. 502).

By way of comparison, in the prior art the reference of the comparator 30 is ordinarily permanently connected to some fixed reference voltage which permits the comparator 30 to switch at a switch time period $t_{fuse}$. As an example, assume the voltage to be 2.5 V, and the switch time period $t_{fuse}$ to be equal to 40 nanoseconds when the fuse has a resistance of 300 KΩ. With the external access circuit 212 to the comparator reference as provided by the present invention, $V_R$ can be changed, for example to 2.0 V, permitting the comparator 208 or 308 to switch at a lower switch time period $t_{fuse}$ of for example 30 nanoseconds. Hence, a time savings of 10 nanoseconds is achieved by varying the reference voltage of the comparator 208 or 308 through circuit 212. The process can be repeated with $V_R$ less than 2.0 V, such as 1.5 V. This new comparator reference voltage of 1.5 V may permit the comparator 30 to switch at a lower switch time period $t_{fuse}$ of say 25 nanoseconds. The process can again be repeated as desired or until the comparator 208 or 308 no longer switches for a lower reference voltage. In this manner, the comparator reference voltage can be optimized such that the switch time period $t_{fuse}$ can be minimized. Because all fuses are tested, the present invention permits a significant amount of testing time to be saved.

As to FIG. 7 and the steps enumerated therein, in a situation where the voltage across a fuse is caused to charge in a manner consistent with an RC circuit, the voltage across the control resistor is caused to charge, instead of allowing it to decay, in steps 706 and 714 (of FIG. 7). The other steps remain the same.

Figure 8:
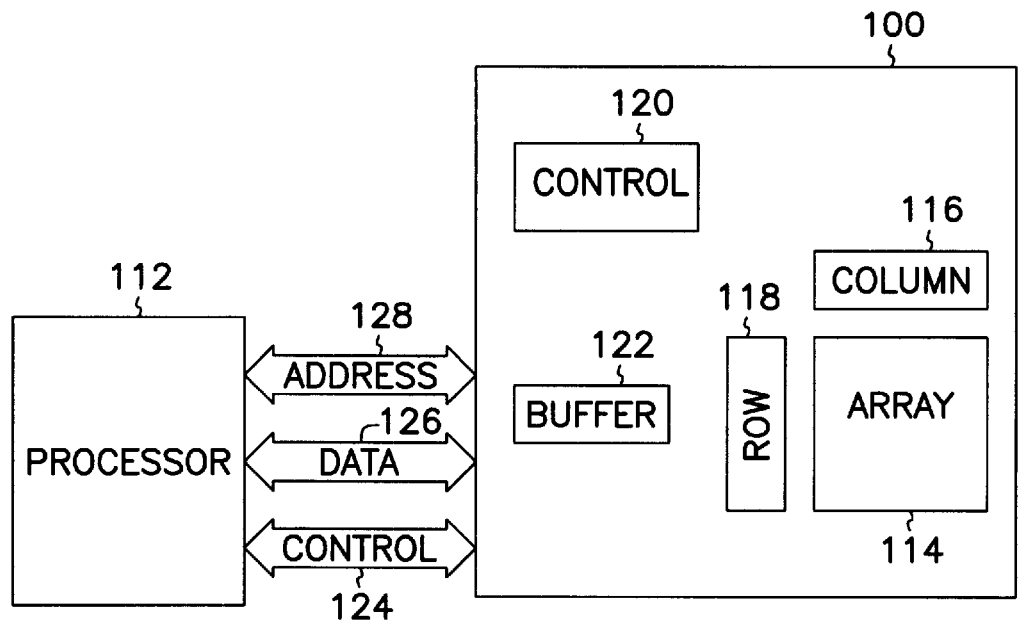
FIG. 8 is a block diagram of a memory to which embodiments of the present invention may be electrically connected.

FIG. 8 illustrates a simplified block diagram of a DRAM 100. The memory device can be coupled to a processor 112 such as a microprocessor of a personal computer. The memory device 100 includes a memory array 114 having rows and columns of memory cells. Column decoder 116 and row decoder 118 are provided to access the memory array in response to address signals provided by the processor 112 on address communication lines 128. Data communication is conducted via I/O buffer circuitry 122 and bi-directional data communication lines 126 (DQ). Internal control circuitry 120 accesses the memory array in response to commands provided by the processor 112 on control lines 124. The control lines can include Row Address strobe (RAS*), Column Address Strobe (CAS*), Write Enable (WE*), Output Enable (OE*), and by using other conventional control signals (not shown) which are well known to those skilled in the art. It will be appreciated by those skilled in the art that the present invention is equally applicable to other types of memory devices including, but not limited to, SRAM, SDRAM, EDO, Burst EDO, and VRAM. Those skilled in the art will recognize that, in an alternate embodiment, DRAM memory array 114 may be accessed by a DRAM controller (not shown) instead of microprocessor 112. Additional embodiments of the present invention may comprise a testing circuit, as described above, electrically connected to a memory such as memory 100 to test the system as has been described above. Another embodiment of the present invention is a memory such as memory 100 manufactured or provided with circuitry as described above to test the memory 100.

Figure 9:
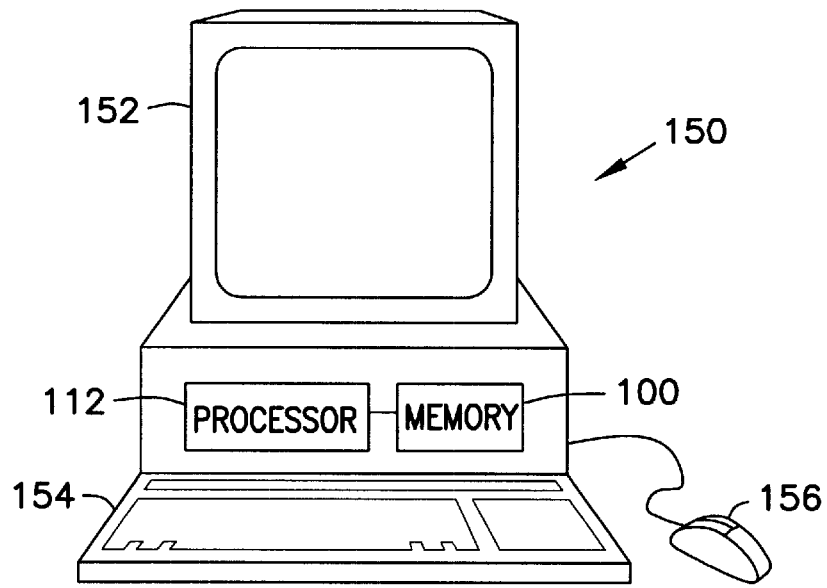
FIG. 9 is a perspective view of a typical computer system to which embodiments of the present invention may be electrically connected.

FIG. 9 shows a computer system setup 150 in block diagram. Computer system 150 typically includes processor 112, memory such as memory 100, monitor 152, keyboard or other input device 154, mouse or other pointing device 156, and data storage (not shown) including but not limited to a hard drive, floppy drive, CD-ROM or DVD-ROM. Other components may be added to computer system 150, as is well known in the art. In yet another embodiment of the present invention, a computer system is electrically connected to a memory, the memory having electrically connected thereto a testing circuit such as those described above. Still yet another embodiment of the present invention comprises a computer system such as computer system 150 provided with a memory having a memory testing circuit such as those described above electrically connected thereto.

Conclusion

An exemplary method embodiment for testing a fuse in an integrated circuit comprises determining a testing time for a control resistor, determining a testing time for the fuse, and comparing the testing time for the fuse against the testing time for the control resistor.

An exemplary method for determining a desired test time for a fuse comprises initializing a reference voltage in a testing circuit, applying a pre-charge voltage across the control resistor, determining the time at which the pre-charge voltage decays to a value less than the reference voltage in the testing circuit, adjusting the reference voltage if the determined decay time is greater than a preselected desired decay time, repeating the application of the pre-charge voltage across the control resistor to adjusting the reference voltage if necessary, and selecting the determined decay time as the test time.

An alternative exemplary method for determining a desired test time for a fuse comprises initializing a reference voltage in a testing circuit, applying a pre-charge voltage across the control resistor, determining the time at which the pre-charge voltage charges to a value greater than the reference voltage in the testing circuit, adjusting the reference voltage if the determined charge time is greater than a preselected desired charge time, repeating the application of the pre-charge voltage across the control resistor to adjusting the reference voltage as necessary, and selecting the determined charge time as the test time.

An exemplary circuit embodiment of the present invention for testing fuses in an integrated circuit comprises a bank of control resistors electrically interposed between a first supply node and a second supply node, and a testing circuit having an input and an access to a reference in the testing circuit, wherein the input of the testing circuit is in electrical communication with the first supply node.

Further embodiments of the apparatus for testing fuses in an integrated circuit comprise a bank of control resistors electrically interposed between a first supply node and a second supply node, a testing circuit having an input and an access to a reference in the testing circuit, wherein the input of the testing circuit is in electrical communication with the first supply node, wherein the bank of control resistors comprises a plurality of elements connected in parallel and electrically interposed between a first node and the second supply node, wherein the first node is connected to a pre-charge voltage, and wherein the second supply node is connected to a potential lower than the first supply node and the first node, and wherein the elements comprise a first switching device connected in series with a control resistor. Alternatively, the second supply node may be connected to a potential higher than the first supply node and the first node.

It is to be understood that the above description is intended to be illustrative, and not restrictive. Many other embodiments will be apparent to those of skill in the art upon reviewing the above description. As previously mentioned, the use of fuses and antifuses are one design choice, as well as the location of the fuses, and various methods of setting the fuses are well within the scope of the invention. Further, it is well known that memory devices are comprised of multiple subarrays, each subarray having corresponding redundant rows and/or columns, or a bank of redundant rows and/or columns being provided for all the subarrays. The sizes and numbers of subarrays can also be varied without departing from the invention. Still further, other types of memory devices making use of redundant rows and/or columns of memory selectable by whatever method may make use of the present invention.

What is claimed is:

1. A method for testing a programmed fuse in an integrated circuit, the method comprising:
    selecting a control resistor fabricated to have a known resistance;
    measuring a testing time for the control resistor having the known resistance;
    measuring a testing time for the programmed fuse having an unknown resistance; and
    comparing the testing time for the programmed fuse against the testing time for the control resistor and determining the resistance of the programmed fuse therefrom.
    applying a voltage to the control resistor; and
    measuring a time period for the voltage to decay to a decayed voltage less than or equal to a reference voltage.

2. The method of claim 1, further comprising selecting a resistance value of the control resistor from a plurality of known resistances according to a design parameter.

3. The method of claim 1, further comprising deciding, after comparing, whether the testing time for the programmed fuse meets specification parameters based on the testing time for the control resistor.

4. The method of claim 1, wherein measuring the testing time for the control resistor further comprises:
    selecting the control resistor from a plurality of resistors having known resistances;
    initializing a reference voltage in a testing circuit;
    applying a pre-charge voltage across the control resistor;
    allowing the pre-charge voltage to decay;
    determining a first time at which the pre-charge voltage has decayed to a value less than the reference voltage in the testing circuit;
    adjusting the reference voltage in the testing circuit to obtain an updated reference voltage;
    applying the pre-charge voltage across the control resistor;
    allowing the pre-charge voltage to decay;
    determining a second time at which the pre-charge voltage has decayed to a value less than the reference voltage in the testing circuit;
    repeating adjusting through determining a second time if the second time is less than the first time; and
    selecting the first time as the testing time for the control resistor.

5. The method of claim 1, wherein measuring the testing time for the control resistor further comprises:
    selecting the control resistor from a plurality of resistors having known resistances;
    initializing a reference voltage in a testing circuit;
    applying a voltage across a control resistor;
    causing the voltage across the control resistor to charge;
    determining a first time at which the voltage across the control resistor has increased to a value greater than the reference voltage in the testing circuit;
    adjusting the reference voltage in the testing circuit to obtain an updated reference voltage;
    applying a voltage across the control resistor;
    causing the voltage across the control resistor to charge;
    determining a second time at which the voltage across the control resistor has increased to a value greater than the reference voltage in the testing circuit;
    repeating adjusting through determining a second time if the second time is less than the first time; and
    selecting the first time as the testing time for the control resistor.

6. The method of claim 1, wherein measuring the testing time for the control resistor comprises:
applying a voltage to the control resistor; and
measuring a time period for the voltage to decay to a decayed voltage less than equal to a reference voltage.

7. The method of claim 6, further comprising applying the charged voltage to a comparator which compares the decayed voltage to the reference voltage.

8. The method of claim 1, wherein measuring the testing time for the programmed fuse comprises:
applying a voltage to the programmed fuse; and
measuring a time period for the voltage to decay to a decayed voltage less than or equal a reference voltage.

9. The method of claim 8, further comprising applying the charged voltage to a comparator which compares the charged voltage to the reference voltage.

10. The method of claim 1, wherein measuring the testing time for the control resistor comprises:
applying a voltage to the control resistor; and
measuring a time period for the voltage to charge to a charged voltage greater than or equal to a reference voltage.

11. The method of claim 10, further comprising applying the charged voltage to a comparator which compares the charged voltage to the reference voltage.

12. The method of claim 1, wherein measuring the testing time for the programmed fuse comprises:
applying a voltage to the programmed fuse; and
measuring a time period for the voltage to charge to a charged voltage greater than or equal to a reference voltage.

13. The method of claim 12, further comprising applying the charged voltage to a comparator which compares the charged voltage to the reference voltage.

14. A method for testing a programmed fuse in an integrated circuit, comprising:
selecting a control resistor having;
measuring decay time of the voltage across the control resistor to produce therefrom a test time;
selecting a programmed fuse having an unknown resistance;
applying the test voltage across the programmed fuse;
measuring decay time of the voltage across the programmed fuse to produce therefrom a fuse time;
comparing the test time to the fuse time to determine if the programmed fuse was programmed correctly.

15. The method according to claim 14 wherein selecting the control resistor further includes selectively connecting at least two resistors having known resistances to produce a desired resistance value for the control resistor.

16. A method for testing a programmed fuse in an integrated circuit, comprising:
selecting a control resistor having a known resistance;
selecting a reference voltage;
applying a test voltage across the control resistor;
comparing the test voltage across the control resistor to the reference voltage;
measuring a test time when the test voltage matches the reference voltage;
selecting a programmed fuse having an unknown resistance;
applying the test voltage across the programmed fuse;
comparing the test voltage across the programmed fuse to the reference voltage;
measuring a fuse time when the test voltage matches the reference voltage;
comparing the test time to the fuse time to determine if the fuse was programmed correctly.

17. The method according to claim 16 wherein selecting the reference voltage includes selecting an increased reference voltage to shorten the test time.

18. The method according to claim 16 wherein selecting the reference voltage further comprises:
initializing the reference voltage in a comparator circuit;
applying a pre-charge voltage across the control resistor;
determining the determined time at which the pre-charge voltage decays to match the reference voltage in the comparator circuit;
increasing the reference voltage;
repeat the steps of applying, determining and increasing until the comparator no longer determines the match; and
selecting the determined decay time at the test time.

19. A method for testing a programmed fuse in an integrated circuit, the method comprising:
selecting a control resistor on the integrated circuit which has a known resistance;
measuring a testing time for the control resistor having the known resistance;
measuring a testing time for the programmed fuse having an unknown resistance; and
comparing the testing time for the programmed fuse against the testing time for the control resistor to determine if the programmed fuse was properly programmed.

20. A method for testing a programmed fuse in an integrated circuit, the method comprising:
selecting a control resistor to have a selectable known resistance;
selecting a resistance value for the control resistor;
measuring a testing time for the control resistor;
measuring a testing time for the programmed fuse having an unknown resistance; and
comparing the testing time for the programmed fuse against the testing time for the control resistor to determine the resistance of the programmed fuse to determine if the programmed fuse was properly programmed.

21. A method for testing a programmed fuse in an integrated circuit, the method comprising:
selecting a control resistor fabricated to have a plurality of selectable resistance values;
selecting a resistance value for the control resistor from the plurality of selectable resistance values;
measuring a control testing time for the control resistor;
measuring a testing time for the programmed fuse having an unknown resistance; and
comparing the testing time for the programmed fuse to the control testing time to determine the resistance of the programmed fuse.

22. A method for testing programmed fuses in an integrated circuit, comprising:
selecting a control resistor onto the integrated circuit fabricated to have a known resistance;
measuring a control testing time for the control resistor;
selecting a first programmed fuse having an unknown resistance;

measuring a first testing time for the first programmed fuse;

comparing the testing time for the programmed fuse against the testing time for the control resistor to determine the resistance of the first programmed fuse;

changing the control testing time to a changed control testing time;

selecting a second programmed fuse;

measuring a second testing time for the second programmed fuse; and comparing the second testing time for the second programmed fuse to the changed control testing time to determine the resistance of the second programmed fuse.

23. A method for testing the state of a programmed anti-fuse in an integrated circuit, the method comprising:

fabricating a control resistor on the integrated circuit to have a plurality of selectable resistance values;

selecting a known resistance value for the control resistor from the plurality of selectable resistance values;

measuring a decay time for the control resistor to produce a known decay time corresponding to the known resistance value;

measuring a decay time for the programmed anti-fuse having an unknown resistance value; and comparing the decay time for the programmed anti-fuse to the known decay time to determine the resistance value of the programmed anti-fuse.

24. A method for testing a programmed anti-fuse in an integrated circuit, the method comprising:

fabricating a control resistor on the integrated circuit to have a plurality of selectable resistance values;

selecting a known resistance value for the control resistor from the plurality of selectable resistance values;

applying a pre-charge voltage across the control resistor;

comparing a decay voltage for the control resistor to a reference voltage to produce a known decay time corresponding to the known resistance value;

applying the pre-charge voltage across the programmed anti-fuse;

comparing a decay voltage for the programmed anti-fuse to the reference voltage to determine an anti-fuse decay time to for the programmed anti-fuse; and comparing the known decay time to the anti-fuse decay time to determine if the anti-fuse was properly programmed.

25. A method for testing a programmed anti-fuse in an integrated circuit, the method comprising:

fabricating a control resistor on the integrated circuit to have a plurality of selectable resistance values;

selecting a known resistance value for the control resistor from the plurality of selectable resistance values;

applying a pre-charge voltage across the control resistor;

comparing a decay voltage for the control resistor to a reference voltage;

measuring the time it takes for the decay voltage to match the reference voltage and producing therefrom a decay time for the control resistor;

adjusting the reference voltage to produce an adjusted reference voltage;

applying the pre-charge voltage across the control resistor;

comparing the decay voltage for the control resistor to the adjusted reference voltage;

measuring the time it takes for the decay voltage to match the adjusted reference voltage and producing therefrom a new decay time for the control resistor;

applying the pre-charge voltage across a programmed anti-fuse;

comparing a decay voltage for the programmed anti-fuse to the adjusted reference voltage;

measuring the time it takes for the decay voltage to match the adjusted reference voltage to determine if the programmed anti-fuse was properly programmed.

* * * * *

UNITED STATES PATENT AND TRADEMARK OFFICE
CERTIFICATE OF CORRECTION

PATENT NO. : 6,424,161 B2
DATED : July 23, 2002
INVENTOR(S) : Tim Damon and Phillip E. Byrd It is certified that error appears in the above-identified patent and that said Letters Patent is hereby corrected as shown below:

Column 10,
Line 10, delete "applying a voltage to the control resistor; and measuring a time period for the voltage to decay to decayed voltage less than or equal to a reference voltage." after "therefrom".

Column 11,
Lines 7, 15 and 16, delete "charged" and insert -- decayed --, therefor.
Line 38, insert -- a known resistance -- after "having".

Column 12,
Line 20, delete "at" and insert -- as --, therefor.

Signed and Sealed this

Tenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.   : 6,424,161 B2
DATED        : July 23, 2002
INVENTOR(S)  : Tim Damon and Phillip E. Byrd It is certified that error appears in the above-identified patent and that said Letters Patent is hereby corrected as shown below:

Column 10,
Line 10, "applying a voltage to the control resistor; and measuring a time period for the voltage to decay to decayed voltage less than or equal to a reference voltage." after "therefrom" (as deleted by Certificate of Correction issued December 10, 2002) should be reinstated.

Column 11,
Lines 7, 15 and 16, "charged" (as deleted by Certificate of Correction issued December 10, 2002) should be reinstated.
Line 38, insert -- a known resistance -- after "having".

Column 12,
Line 20, delete "at" and insert -- as --, therefor.

Signed and Sealed this

Thirtieth Day of March, 2004

JON W. DUDAS
*Acting Director of the United States Patent and Trademark Office*